(12) United States Patent
Robertson (10) Patent No.: US 11,907,100 B2
(45) Date of Patent: Feb. 20, 2024

(54) GENERATION OF TRACE MESSAGES INCLUDING AN INSTRUCTION RETIREMENT COUNT AND A STALL COUNT

(71) Applicant: SIEMENS INDUSTRY SOFTWARE INC., Plano, TX (US)

(72) Inventor: Iain Robertson, Bedford (GB)

(73) Assignee: Siemens Industry Software Inc., Plano, TX (US)

( * ) Notice: Subject to any disclaimer, the term of this patent is extended or adjusted under 35 U.S.C. 154(b) by 81 days.

(21) Appl. No.: 16/850,100

(22) Filed: Apr. 16, 2020

(65) Prior Publication Data

US 2020/0334128 A1 Oct. 22, 2020

(30) Foreign Application Priority Data

Apr. 16, 2019 (GB) ...................................... 1905366

(51) Int. Cl.
*G06F 11/34* (2006.01)
*G06F 11/36* (2006.01)
*H03M 7/40* (2006.01)

(52) U.S. Cl.
CPC ........ *G06F 11/3636* (2013.01); *G06F 11/348* (2013.01); *G06F 11/3423* (2013.01); *H03M 7/40* (2013.01); *G06F 2201/81* (2013.01); *G06F 2201/88* (2013.01)

(58) Field of Classification Search
CPC ............. G06F 11/3024; G06F 11/3423; G06F 11/3476; G06F 11/348; G06F 2201/88
See application file for complete search history.

(56) References Cited

U.S. PATENT DOCUMENTS

| 6,085,338 A | 7/2000 | Levine et al. |
| 7,231,551 B1 * | 6/2007 | Treue .................. G06F 11/3636 714/30 |
| 2007/0247350 A1 * | 10/2007 | Ryan ...................... H03M 7/30 342/65 |
| 2008/0201591 A1 * | 8/2008 | Hu .......................... G06F 1/329 713/323 |

(Continued)

FOREIGN PATENT DOCUMENTS

JP 2013537346 A 9/2013

OTHER PUBLICATIONS

PowerPC 604E RISC Microprocessor User's Manual, 1998, "PowerPC 604e RISC Microprocessor User's Manual, Chapter 9: Performance Monitor", pp. 1-18, Available online: https://www.nxp.com/docs/en/reference-manual/MPC604EUM.pdf.

*Primary Examiner* — Jacob Petranek
(74) *Attorney, Agent, or Firm* — Lempia Summerfield Katz LLC (57) ABSTRACT

A method of tracing instruction execution on a processor of an integrated circuit chip in real time whilst the processor continues to execute instructions during clock cycles of the processor. The instruction execution of the processor is monitored by counting the number of successive instructions which are retired contiguously in time to form an instruction count, and counting the number of subsequent contiguous clock cycles of the processor during which no instruction is retired to form a stall count. A trace message is generated which includes the instruction count and the stall count, and the trace message is outputted.

17 Claims, 6 Drawing Sheets

(56) References Cited

U.S. PATENT DOCUMENTS

| | | | | |
|---|---|---|---|---|
| 2008/0294881 A1* | 11/2008 | Chen | ............... | G06F 11/3471 712/227 |
| 2009/0019317 A1* | 1/2009 | Quach | ............... | G06F 11/3466 714/47.1 |
| 2010/0318972 A1* | 12/2010 | Xu | ............... | G06F 9/3808 717/128 |
| 2011/0173431 A1* | 7/2011 | Salapura | ............... | G06F 11/348 713/100 |
| 2014/0359633 A1* | 12/2014 | Breternitz | ............... | G06F 9/5094 718/104 |
| 2015/0248295 A1* | 9/2015 | Michalak | ............... | G06F 11/3024 712/216 |
| 2016/0062869 A1 | 3/2016 | Bansal et al. | | |

* cited by examiner

GENERATION OF TRACE MESSAGES INCLUDING AN INSTRUCTION RETIREMENT COUNT AND A STALL COUNT

FIELD OF THE INVENTION

This invention relates to tracing instruction execution on a processor, such as a CPU (central processing unit), on an integrated circuit chip.

BACKGROUND

In the past, an embedded system which had multiple core devices (processors, memories etc.) would have been incorporated onto a Printed Circuit Board (PCB) and connected on the PCB via buses. Traffic in the embedded system was conveyed over these buses. This arrangement was convenient for monitoring the core devices, because monitoring tools such as oscilloscopes and logic analyzers could be attached to the PCB's buses allowing direct access to the core devices.

Market demand for smaller products coupled with advances in semiconductor technology has led to the development of System-on-Chip (SoC) devices. In a SoC, the multiple core devices of an embedded system are integrated onto a single chip. In a SoC, the traffic in the embedded system is conveyed over internal buses, thus connection of monitoring tools directly to the system bus is no longer possible. The resulting reduced access coupled with an increasing quantity of data being transported around the chip (due to developments of SoC technology leading to integration of multiple processing cores and higher internal clocking frequencies), has reduced the ability of external monitoring tools to monitor the system for security breaches, bugs, and safety concerns within the timescales demanded by the industry. Additionally, when multiple core devices are embedded onto the same single chip, the behaviour of each individual core device differs from its behaviour in isolation due to its interaction with the other core devices as well as real time events such as triggers and alerts.

Thus, the development of SoC devices required associated development in monitoring technology, which led to the integration of some monitoring functionality onto the SoC. It is now known for on-chip monitoring circuitry to trace execution of programs running on core devices such as CPUs. The trace data is generally output for analysis off-chip. However, that trace data provides limited temporal detail about the program execution of the core processors. More detailed trace data is desirable.

SUMMARY OF THE INVENTION

According to a first aspect, there is provided a method of tracing instruction execution on a processor of an integrated circuit chip in real time whilst the processor continues to execute instructions during clock cycles of the processor, the method comprising: at tracing circuitry on the integrated circuit chip: monitoring the instruction execution of the processor by: counting the number of successive instructions which are retired contiguously in time to form an instruction count; and counting the number of subsequent contiguous clock cycles of the processor during which no instruction is retired to form a stall count; generating a trace message which includes the instruction count and the stall count; and outputting the trace message.

The method may further comprise comparing the stall count to a threshold stall count; and only if the stall count is the same as or exceeds the threshold stall count, generating and outputting the trace message.

The method may comprise if the stall count is less than the threshold stall count: resetting the stall counter to a count of 0; counting a further number of successive instructions which are retired contiguously; counting the number of subsequent contiguous clock cycles of the processor during which no instruction is retired to form a further stall count; comparing the further stall count to the threshold stall count; and only if the further stall count is the same as or exceeds the threshold stall count: generating a trace message including a further instruction count and the further stall count, the further instruction count being the sum of the instruction count, the stall count and the further number of successive instructions which are retired contiguously; and outputting the trace message.

The method may comprise incrementing the instruction count by the stall count to form an incremented instruction count, wherein counting the further number of successive instructions which are retired contiguously starts from the incremented instruction count, thereby forming the further instruction count.

The method may comprise resetting the instruction counter to a count of 0, wherein counting the further number of successive instructions which are retired contiguously starts from 0, the method further comprising adding the instruction count, the stall count and the further number of successive instructions which are retired contiguously to form the further instruction count.

The method may comprise, if the further stall count is less than the threshold stall count, iteratively performing the above-described method, and only when an iterative stall count is the same as or exceeds the threshold stall count, generating and outputting a trace message.

According to a second aspect, there is provided a method of tracing instruction execution on a processor of an integrated circuit chip in real time whilst the processor continues to execute multiple instructions contemporaneously during clock cycles of the processor, the processor being capable of retiring more than one instruction per clock cycle, the method comprising: at tracing circuitry on the integrated circuit chip: monitoring the instruction execution of the processor by: counting the number of instructions retired in each clock cycle to form a clock cycle count; and counting the number of contiguous clock cycles of the processor during which no instruction is retired to form a stall count; generating a trace message which includes the clock cycle count and the stall count; and outputting the trace message.

The method may further comprise counting the number of non-retired instruction executions to form a non-retired count.

The trace message may further include the non-retired count.

The method may further comprise encoding the counts in the trace message using run length encoding.

The method may comprise encoding the counts in the trace message using Elias Gamma code. According to a third aspect, there is provided an integrated circuit chip comprising: a processor configured to execute instructions during clock cycles of the processor; tracing circuitry configured to trace instruction execution of the processor in real time, the tracing circuitry comprising: an instruction counter configured to count the number of successive instructions which are retired contiguously in time to form an instruction count; a stall counter configured to count the number of subsequent contiguous clock cycles of the processor during which no instruction is retired to form a stall count; a message generator configured to generate a trace message which includes the instruction count and the stall count; and an output configured to output the trace message.

The integrated circuit chip may further comprise a comparator configured to compare the stall count to a threshold stall count.

According to a fourth aspect, there is provided an integrated circuit chip comprising: a processor configured to retire more than one instruction per clock cycle of the processor; tracing circuitry configured to trace instruction execution of the processor in real time, the tracing circuitry comprising: a clock cycle counter configured to count the number of instructions retired in each clock cycle to form a clock cycle count; a stall counter configured to count the number of contiguous clock cycles of the processor during which no instruction is retired to form a stall count; a message generator configured to generate a trace message which includes the clock cycle count and the stall count; and an output configured to output the trace message.

The integrated circuit chip may further comprise a further counter configured to count the number of non-retired instruction executions to form a non-retired count.

BRIEF DESCRIPTION OF THE DRAWINGS

The present invention will now be described by way of example with reference to the accompanying drawings. In the drawings.

DETAILED DESCRIPTION

The following disclosure describes a monitoring architecture suitable for implementation on an integrated circuit chip. The integrated circuit chip may be a SoC or a multi-chip module (MCM).

Figure 4:
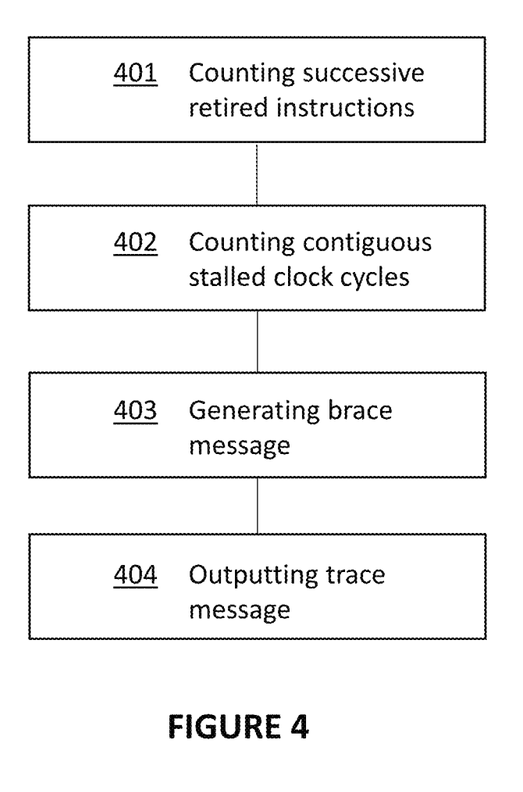
FIG. 4 illustrates a method of tracing instruction execution of a processor.
Figure 5:
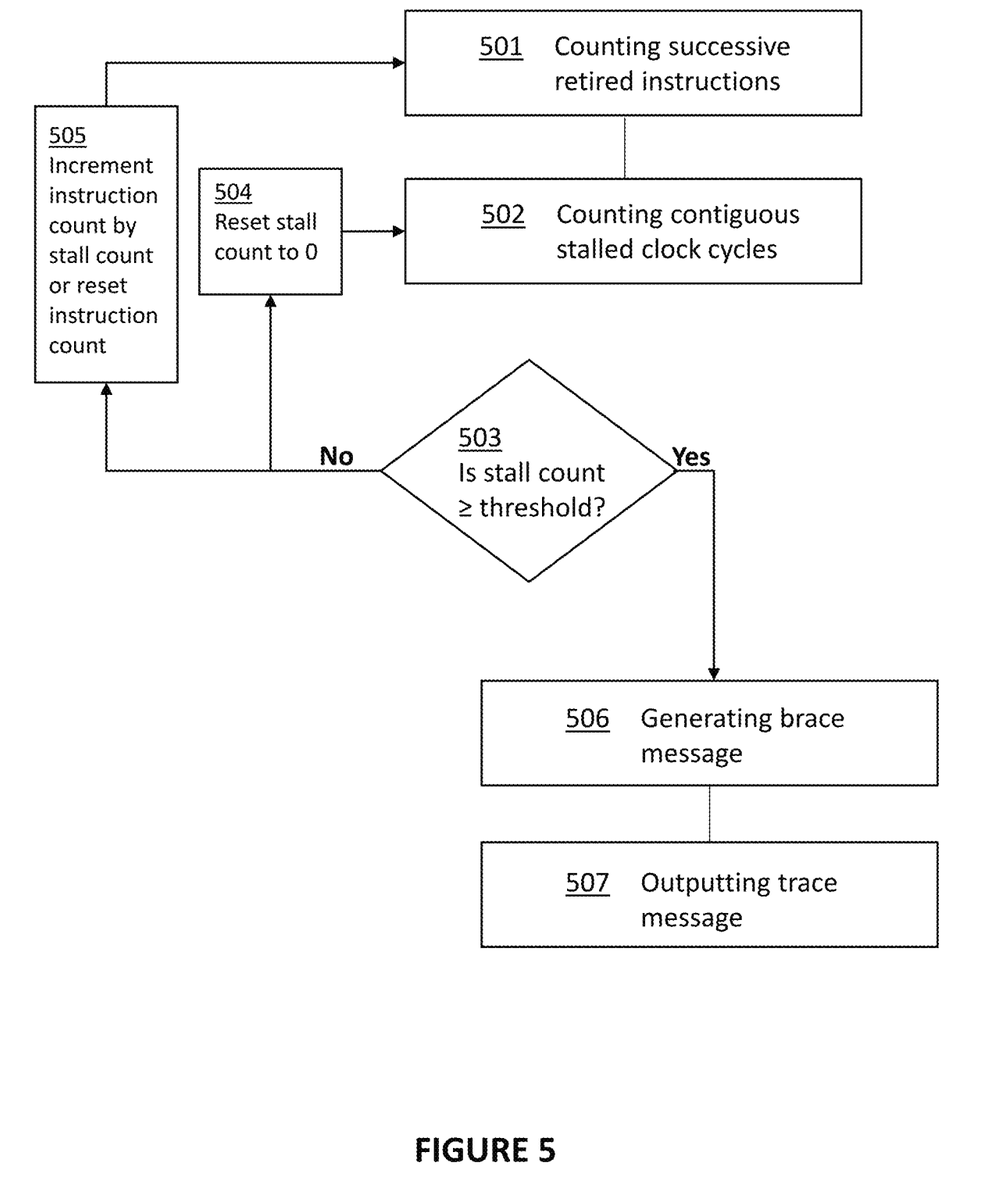
FIG. 5 illustrates a further method of tracing instruction execution of a processor.
Figure 6:
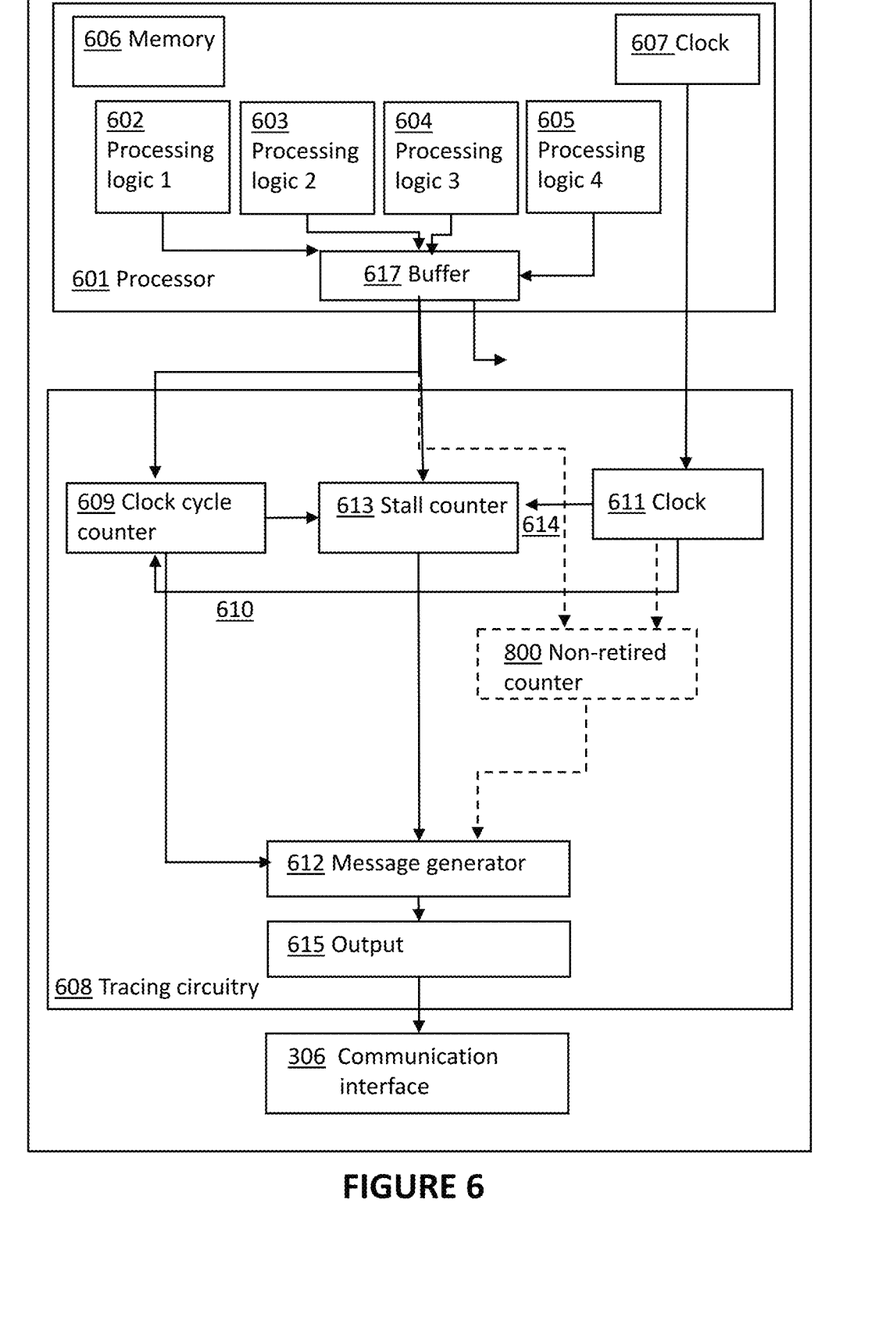
FIG. 6 is a schematic drawing of an exemplary monitoring architecture for tracing a superscalar processor.
Figure 7:
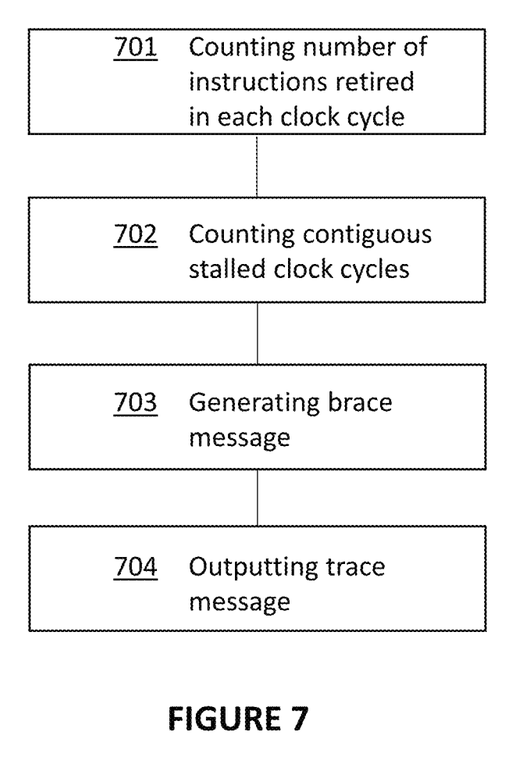
FIG. 7 illustrates a method of tracing instruction execution of a superscalar processor.

FIGS. 1 to 3 and 6 are schematic diagrams of exemplary monitoring architectures, and components within monitoring architectures. These figures present the structures in terms of functional blocks. Some functional blocks for carrying out functions well known in the art have in places been omitted from these figures. FIGS. 4, 5 and 7 are flowcharts illustrating methods of tracing a processor. Each flowchart depicts an order in which the method of that flowchart can be performed. However, the flowcharts are not intended to restrict the described methods to being implemented in the orders depicted. The steps of the methods may be carried out in alternative orders to those depicted in the flowcharts.

Figure 1:
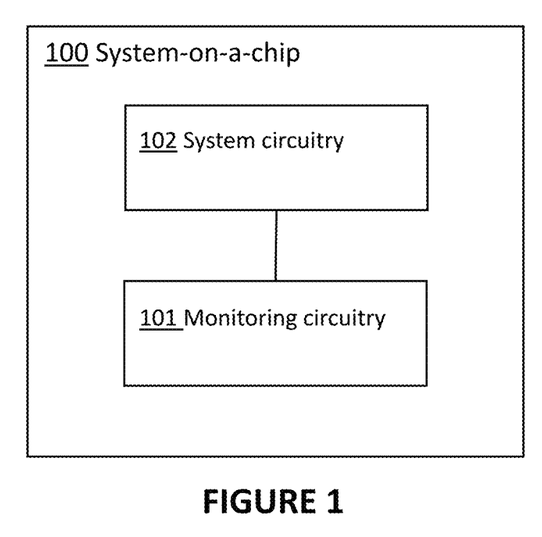
FIG. 1 is a schematic drawing of an exemplary monitoring architecture on an integrated circuit chip device.
Figure 2:
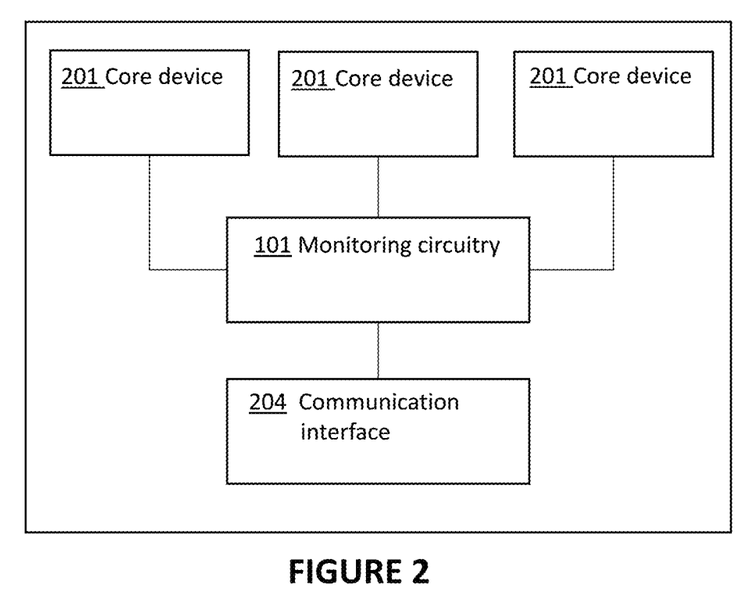
FIG. 2 is a schematic drawing of an exemplary monitoring architecture on an integrated circuit chip device.

FIG. 1 illustrates the general structure of an exemplary monitoring architecture for a SoC 100. Monitoring circuitry 101 is arranged to monitor system circuitry 102. FIG. 2 illustrates exemplary system circuitry comprising core devices and a communication interface. Core devices 201, 202 and 203 of the SoC are each connected to monitoring circuitry 101. Although FIG. 2 illustrates three core devices, any number of core devices can be suitably integrated into the monitoring architecture. Exemplary core devices include a DSP (digital signal processor), video processor, applications processor, CPU, graphics processor, system memory, bus, system interconnect, RTOS (real-time operating system), software, data, custom circuit and a data engine. However, any component of a SoC is suitable for being incorporated into the monitoring architecture as a core device on FIG. 2. The core devices may be emulators or simulators of other devices on the chip. For example, a core device may emulate a processor.

The monitoring circuitry is able to monitor the operation of the core devices, and optionally also able to manipulate the operation of the core devices. The monitoring circuitry is connected to a communication interface 204. Communication interface 204 may be configured to communicate with entities off-chip. For example, monitoring circuitry 101 may communicate with an off-chip analyser via communication interface 204. Communication interface 204 may also be configured to communicate with other entities on-chip. For example, monitoring circuitry 101 may communicate with an on-chip analyser via communication interface 204. Although FIG. 2 illustrates one communication interface, any number of communication interfaces can be integrated onto the SoC. The communication interfaces implemented are chosen in dependence on the type of connections that are to be made. Exemplary communication interfaces include: JTAG, parallel trace input/output, and Aurora based high-speed serial interface; and reuse of system interfaces such as USB, Ethernet, RS232, PCIe and CAN. Within monitoring circuitry 101, there may be distinct monitoring circuitry associated with each core device. Alternatively, or in addition, some monitoring circuitry may be associated with two or more core devices.

The following description focuses on examples in which a core device of FIG. 2 is a processor, and that processor is monitored by tracing circuitry of the monitoring circuitry 101. The processor may, for example, be a CPU, GPU or DSP.

Figure 3:
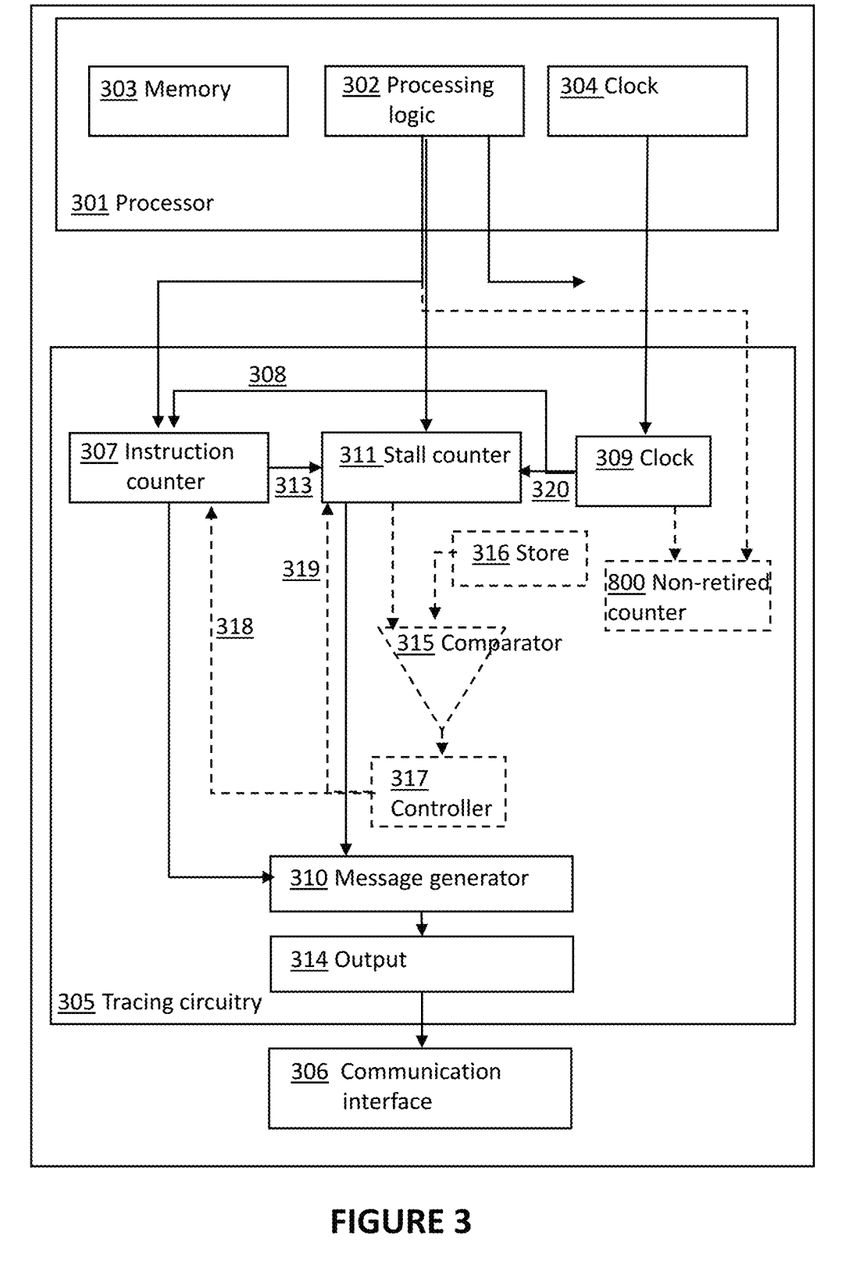
FIG. 3 is a schematic drawing of an exemplary monitoring architecture for tracing a processor.

With reference to the architecture illustrated on FIG. 3, the processor 301 comprises processing logic 302 which executes programs, also known as instructions. These executable instructions are stored in memory 303. The processor is clocked at a clocking rate. Thus, the processor 301 executes instructions during clock cycles of the processor. The clocking rate may be that set by a clock 304 internal to the processor. The processor may take a single clock cycle to complete executing an instruction. The processor may take several clock cycles to complete executing an instruction. Using pipelining, the processor may be mid-execution of several instructions at the same time. However, the processor starts executing a maximum of one instruction in each clock cycle. The processor retires a maximum of one instruction in each clock cycle. As used herein, the term "retired" is used in conjunction with an instruction to mean that the processor has completed execution of that instruction.

Tracing circuitry 305 traces the instruction execution of processor 301. This is done unobtrusively. The tracing circuitry 305 monitors the processor 301 without interrupting the operation of the processor. In other words, the tracing circuitry traces the processor without requiring the processor to halt or modify its execution of instructions. The processor can continue to run as normal. Thus, the processor can continue to execute instructions and output to other circuitry on and/or off the chip. The tracing circuitry traces the processor 301 and outputs trace data in real time.

Tracing circuitry 305 comprises an instruction counter 307. The instruction counter 307 receives the processor output from processor 301. Instruction counter 307 may also receive a clock input 308 from clock 309. Clock 309 is internal to tracing circuitry 305. Clock 309 may receive its clock signal from processor clock 304. The instruction counter 307 counts the number of successive instructions which are retired contiguously in time to form an instruction count. When the instruction counter identifies a time gap in which the processor does not retire an instruction, it responds by stopping counting. The instruction counter may then output its instruction count to message generator 310.

Tracing circuitry 305 also comprises a stall counter 311. The stall counter 311 receives the processor output from processor 301. Stall counter 311 also receives a clock input 312 from clock 309. The stall counter 311 also receives an output 313 from the instruction counter 307.

This output identifies when the instruction counter has stopped counting. The stall counter counts the number of contiguous clock cycles of the processor during which no instruction is retired to form a stall count. The stall counter starts this count immediately following the end of a series of successively retired instructions which are contiguous in time, as counted by the instruction counter. The stall counter starts the count on receiving a signal 313 from the instruction counter identifying that it has stopped counting. When the stall counter identifies that an instruction has been retired, it responds by stopping counting. The stall counter 311 is clocked by clock 309 at the same clocking rate as the processor 301. This may be by virtue of the clock 309 receiving the processor's clock signal 304. Thus, the number of clock cycles counted by the stall counter 311 is the same as the number of the processor's clock cycles that the processor has stalled for. The stall counter 311 outputs its stall count to message generator 310.

Message generator 310 generates a trace message which includes the instruction count and the stall count. Output 314 outputs the trace message from tracing circuitry 305. The trace message may then be output to communication interface 306. Communication interface 306 may then output the trace message off-chip and/or route the trace message on-chip, as described above with reference to communication interface 204 of FIG. 2.

Thus, with reference to FIG. 4, the tracing circuitry 305 of FIG. 3 monitors instruction execution by processor 301 as follows. At step 401, the instruction counter 307 counts the number of successive instructions which are retired contiguously in time to form an instruction count. Immediately following this, at step 402, the stall counter counts the number of subsequent contiguous clock cycles of the processor during which no instruction is retired to form a stall count. At step 403, the message generator generates a trace message which includes the instruction count and the stall count. At step 404, output 314 outputs the trace message.

The instruction counter continues to receive the processor output from processor 301. Following outputting its instruction count to message generator 310, instruction counter resets its count to 0. Instruction counter 307 then starts counting again when it receives the next retired instruction from processor 301, and the method of FIG. 4 repeats. The stall counter also continues to receive the processor output from processor 301. Following outputting its stall count to message generator 310, stall counter resets its count to 0. Stall counter 311 then starts counting again on receiving the next signal 313 from the instruction counter identifying that it has stopped counting.

Thus, the apparatus of FIG. 3 and the method of FIG. 4 enable on-chip monitoring circuitry to trace the instruction execution of a processor and output timing data identifying how many successive instructions the processor retires and how long the processor stalls before resuming instruction execution. The processor may stall because, for example, a cache has been missed, there is an unexpected branch in the instruction, an instruction has been missed, or an instruction is uncompleted. The timing data is then analysed, alongside other monitoring data. This may be done to reconstruct the program execution flow. It may be done to identify changes that can be made to the instruction set and/or the operation of the processor to optimise the operation of the processor and make the instruction execution more efficient. The other monitoring data may be any monitoring data known to the skilled person in the art. For example, the actual output of the processor, details of register accesses etc.

FIG. 3 also illustrates further optional components internal to the tracing circuitry which is identified on the figure by dashed outlines of those components. This circuitry comprises a comparator 315. The comparator 315 receives as a first input the stall count from stall counter 311. The comparator 315 receives as a second input a threshold stall count from store 316. The comparator compares the stall count to the threshold stall count. The comparator outputs to controller 317. Controller 317 has a control output 318 to instruction counter 307. Controller 317 also has a control output 319 to stall counter 311.

The operation of these additional components will now be described with reference to FIG. 5. At step 501, the instruction counter 307 counts the number of successive instructions which are retired contiguously in time to form an instruction count. Immediately following this, at step 502, the stall counter counts the number of subsequent contiguous clock cycles of the processor during which no instruction is retired to form a stall count. The comparator 315 receives the stall count from the stall counter and also receives the threshold stall count from the store 316. The comparator compares the stall count to the threshold stall count, and outputs the result to controller 317.

At step 503, only if the stall count is the same as or exceeds the threshold stall count, does the controller 317 then control the instruction counter 307 to output its instruction count, and the controller 317 control the stall counter 311 to output its stall count. The message generator receives both the instruction count and the stall count, and proceeds to generate a trace message at step 506. The trace message is then output at step 507. At step 503, if the stall count is less than the threshold stall count, then at step 504, the controller 317 controls the stall counter to discard the stall count. In other words, the controller 317 controls the stall counter to reset its stall count to 0. At step 505, the controller controls the instruction counter to increment its instruction count by the stall count to form an incremented instruction count.

The instruction count and stall count are not output from the instruction counter and stall counter to the message generator. Thus, no message is generated and output containing the instruction count and the stall count. Instead, the method returns to step 501, and continues a further iteration of the flowchart of FIG. 5. This time, starting from a count of the incremented instruction count, the instruction counter counts the number of successive instructions which are retired contiguously to form a further instruction count.

Immediately following this, at step 502, starting from a count of 0, the stall counter counts the number of subsequent contiguous clock cycles of the processor during which no instruction is retired to form a further stall count. The stall counter outputs this further stall count to the comparator. The comparator then compares the further stall count to the threshold stall count, and outputs the result to controller 317. Only if the further stall count is the same as or exceeds the threshold stall count, does the controller 317 control the instruction counter 307 to output its further instruction count, and control the stall counter 311 to output its further stall count. The message generator receives both the further instruction count and the further stall count, and proceeds to generate a trace message at step 506. The trace message is output at step 507.

However, if the further stall count is less than the threshold store count, the controller controls the stall counter to reset the stall count to 0 at step 504, and the controller controls the instruction counter to increment the instruction count by the stall count at step 505. No trace message is generated containing the further instruction count and the further stall count. The process of FIG. 5 then repeats again.

The process of FIG. 5 repeats iteratively until an iterative stall count is the same as or exceeds the threshold stall count. Once this happens, the controller controls the instruction counter to output the associated iterative instruction count, and the controller controls the stall counter to output the iterative stall count. The message generator receives these counts and generates a trace message containing the iterative instruction count and the iterative stall count. This trace message is output at step 507.

The instruction counter continues to receive the processor output from processor 301. Following outputting its iterative instruction count to message generator 310, instruction counter resets its count to 0. Instruction counter 307 then starts counting again when it receives the next retired instruction from processor 301, and the method of FIG. 5 repeats. The stall counter also continues to receive the processor output from processor 301. Following outputting its iterative stall count to message generator 310, stall counter resets its count to 0. Stall counter 311 then starts counting again on receiving the next signal 313 from the instruction counter identifying that it has stopped counting.

In the above described method, if the stall count is determined to be less than the stall count threshold, then the stall counter is reset to 0 and the instruction counter is incremented by the stall count. In an alternative implementation, following step 503, if the stall count is less than the stall count threshold, the controller 317 controls an adder (not shown in FIG. 3) to add together the instruction count and the stall count. Both the stall counter and the instruction counter are then reset to 0. The method then returns to step 501, in which, starting from a count of 0, the instruction counter counts the number of successive instructions which are retired contiguously. At step 502, starting from a count of 0, the stall counter counts the number of subsequent contiguous clock cycles of the processor during which no instruction is retired. If, at step 503, the next stall count is less than the stall count threshold, then the controller 317 controls the adder to add the instruction count and the stall count of the current iteration of the method to the result from the previous iteration. The controller then resets the counts of the instruction counter and stall counter to 0, and the method repeats. When an iterative stall count from step 502 is the same as or exceeds the threshold stall count, the controller 317 controls the adder to output its current result to the message generator. The message generator generates a trace message containing the adder's current result as the iterative instruction count. The trace message also contains the iterative stall count.

In an alternative implementation, at step 501, the instruction counter 307 counts the number of successive retired instructions and the number of contiguous stalled clock cycles. In other words, the instruction counter 307 increments by 1 for each retired instruction, and the instruction counter 307 increments by 1 for each stalled clock cycle. At step 502, following a number of successive instructions which are retired contiguously, the stall counter 311 counts the number of subsequent contiguous clock cycles of the processor during which no instruction is retired to form a stall count. The comparator 315 compares the stall count to the threshold store count. If the stall count is less than the threshold stall count, the controller 317 resets the stall counter to 0. The controller 317 takes no action with respect to the instruction counter 307. The instruction counter continues to count the number of successive retired instructions and the number of contiguous stalled clock cycles at step 501. Following a number of successive instructions which are retired contiguously, starting from a count of 0, at step 502, the stall counter 311 counts the number of subsequent contiguous clock cycles of the processor during which no instruction is retired to form an iterative stall count. If, at step 503, the next stall count is less than the stall count threshold, then the controller 317 resets the stall counter to 0, and takes no action with respect to the instruction counter. The method repeats. When an iterative stall count from step 502 is the same as or exceeds the threshold stall count, the controller 317 controls the stall counter to output the iterative stall count to the message generator. The controller 317 also controls the instruction counter to output its instruction count to a subtractor (not shown in FIG. 3) which deducts the iterative stall count from the instruction count to form the iterative instruction count. The subtractor outputs the iterative instruction count to the message generator. The message generator generates a trace message containing the iterative instruction count and the iterative stall count.

The threshold stall count may be stored in store 316 at manufacture. Alternatively, the threshold stall count may be configurable. For example, the threshold stall count may be reconfigured dynamically by the entity analysing the trace messages.

The methods described with respect to FIG. 5 do not output a trace message when the processor stalls for a number of cycles smaller than the threshold stall count. Instead, the stall is treated as a retired instruction, and the tracing circuitry continues to count retired instructions. This reduces the number of trace messages which are generated and output compared to the method of FIG. 4 which does not utilise a threshold, and hence is a more efficient tracing method. Suitably, the threshold stall count is dynamically configured by, or on behalf of, the entity analysing the trace messages according to the processor actions that that entity is attempting to capture.

FIG. 3 and the accompanying description describe a processor which is capable of starting execution of a maximum of one instruction per clock cycle, and of retiring a maximum of one instruction per clock cycle. However, the concepts described herein are also applicable to a processor capable of retiring more than one instruction per clock cycle. FIG. 6 illustrates a simplified version of such a processor 601. Processor 601 comprises processing logic 1 602, processing logic 2 603, processing logic 3 604 and processing logic 4 605. Each of these processing logic components executes instructions stored in memory 606 during clock cycles of the processor. Each processing logic outputs its executed instruction to buffer 617. Each processing logic is able to start execution of an instruction in the same clock cycle that another of the processing logics starts executing another instruction. Each processing logic is able to retire an instruction in the same clock cycle that another of the processing logics retires an instruction. Buffer 617 orders the retired instructions such that they are retired from processor 601 in the same order that they started execution. For example, buffer 617 may have four lanes 0, 1, 2 and 3. Buffer 617 re-orders the retired executions from processing logics 1, 2, 3, 4 such that the retired instructions on lanes 0, 1, 2, and 3 respectively are in the same order as the instructions input to the processing logics. The clocking rate may be that set by a clock 607 internal to the processor. Although four processing logic components are shown, there may be two, three or more than four processing logic components in the processor 601, which are capable of starting instruction execution, executing instructions and retiring instructions at the same time. The buffer 617 has the same number of lanes as the number of processing logics.

As with FIG. 3, tracing circuitry 608 traces the instruction execution of processor 601. The tracing circuitry 608 monitors the processor 601 unobtrusively, i.e. without interrupting the operation of the processor.

Tracing circuitry 608 comprises a clock cycle counter 609. The clock cycle counter 609 receives the processor output from the processor 601. Clock cycle counter 609 also receives a clock input 610 from clock 611. Clock 611 is internal to tracing circuitry 608. Clock 611 may receive its clock signal from processor clock 607. The clock cycle counter counts the number of instructions retired in each clock cycle of the processor to form a clock cycle count. The maximum number of instructions retired in each clock cycle of the processor is the number of instructions that the processor is capable of retiring in the same clock cycle. In the example of FIG. 6, the processor 601 is capable of retiring four instructions in the same clock cycle, thus the clock cycle count is either 0, 1, 2, 3 or 4. Clock cycle counter 609 is clocked by clock 611 at the same clocking rate as the processor 601. This may be by virtue of the clock 611 receiving the processor's clock signal 607. Thus, the number of instructions which the clock cycle counter counts as being retired in each clock cycle is the number of instructions which the processor retires in each of the processor's clock cycles. The clock cycle counter outputs its clock cycle count to message generator 612.

Tracing circuitry 608 also comprises a stall counter 613. The stall counter receives the processor output from processor 601. Stall counter also receives a clock input 614 from clock 611. The stall counter counts the number of contiguous clock cycles of the processor during which no instruction is retired, to form a stall count. The stall counter identifies when there is a clock cycle during which no instruction is retired and starts its count from 0. The stall counter stops counting when it identifies a cycle in which an instruction has been retired. The stall counter 613 is clocked by clock 611 at the same clocking rate as the processor 601. This may be by virtue of the clock 611 receiving the processor's clock signal 607. Thus, the number of clock cycles counted by the stall counter 613 is the same as the number of the processor's clock cycles that the processor has stalled for. The stall counter 613 outputs its stall count to message generator 612.

Message generator 612 generates a trace message which includes the clock cycle count and the stall count. Output 615 outputs the trace message from tracing circuitry 608.

The trace message may then be output to communication interface 616. Communication interface 616 may then output the trace message off-chip and/or route the trace message on-chip, as described above with reference to communication interface 204 of FIG. 2.

Thus, with reference to FIG. 7, the tracing circuitry 608 of FIG. 6 monitors instruction execution by processor 601 as follows. At step 701, the clock cycle counter 609 counts the number of instructions retired in a clock cycle of the processor to form a clock cycle count. Immediately following this, at step 702, the stall counter counts the number of contiguous clock cycles of the processor during which no instruction is retired to form a stall count. If the processor retires one or more instructions in the clock cycle immediately after the clock cycle that the clock cycle counter analysed to form the clock cycle count, then the stall counter outputs a stall count which identifies that there was no stall. For example, this stall count value may be 0. As another example, this stall count value may be 1. At step 703, the message generator generates a trace message which includes the clock cycle count and the stall count. At step 704, output 615 outputs the trace message.

The clock cycle counter continues to receive the processor output from processor 601. Following outputting its instruction count to message generator 612, clock cycle counter 609 resets its count to 0. Clock cycle counter 609 then starts counting again at the next clock cycle of the processor, and the method of FIG. 7 repeats.

Thus, the apparatus of FIG. 6 and the method of FIG. 7 enable on-chip monitoring circuitry to trace the instruction execution of a processor and output timing data identifying how many instructions are retired each cycle of the processor, and how many clock cycles the processor stalls for before resuming instruction execution. That timing data is then analysed as described with respect to FIG. 3.

The tracing circuitry of FIGS. 3 and 6 may optionally further comprise a non-retired counter 800. This is illustrated in the figures with a dashed outline. The non-retired counter receives the processor output from processor 301, 601. The non-retired counter also receives a clock input from clock 309, 611. Non-retired counter 800 is clocked by clock 309, 611 at the same clocking rate as the processor 301, 601. The non-retired counter counts the number of missed retirement opportunities. In other words, the non-retired counter counts the number of times an instruction could have been retired but wasn't. For the methods described with respect to FIG. 5, the non-retired counter may, following a group of successive instructions which are retired contiguously in time, count the number of subsequent contiguous clock cycles of the processor during which no instruction is retired. If this count is greater than or the same as the threshold stall count, the non-retired counter discards the count and resets to 0. If the count is less than the threshold stall count, then the non-retired counter outputs this count to the message generator as the non-retired count. For the method described with respect to FIG. 7, the non-retired counter may count the number of instructions which could have been retired in a clock cycle but were not. In the example of FIG. 6, 4 instructions could be retired per clock cycle. Thus, the non-retired counter would have a non-retired count of 0, 1, 2, 3, 4 if 4, 3, 2, 1 or 0 instructions were retired respectively. The non-retired counter outputs this non-retired count to the message generator. The message generator includes the non-retired count in the trace message, which is then output.

The message generator 310,612 may generate a trace message which includes a single instruction count/clock cycle count and a single stall count and optionally a single non-retired count, and output this trace message. Alternatively, the message generator 310 may receive several instruction count/clock cycle count and stall count (and optionally non-retired count) groups from several iterations of the methods described herein, concatenate these groups of counts in the payload of a single trace message, and then output that trace message. For example, the trace message may have a maximum payload length. On receiving an instruction count/clock cycle count and a stall count (and optionally non-retired count) group, the message generator adds the group to the payload of a trace message. If the maximum payload length is not exceeded, then the message generator does not output the trace message. Instead, it waits to receive a further group of counts. On receiving the next group of counts, the message generator adds the group to the payload of the trace message. This process repeats until no further count groups will fit in the payload without exceeding the maximum payload length. At this point, the message generator outputs the trace message to output 314, 615.

The message generator 310, 612 may encode the count values from the trace circuitry counters in the trace message in a compressed format. For example, it may use run length encoding. For example, the message generator may encode the count values using Elias Gamma code. Elias Gamma encoding is particularly efficient when encoding small numbers. In the scenario that a processor stalls frequently, trace messages encoding small count values are generated by the methods described herein at a high rate. Coding efficiency is particularly important in such scenarios to aid minimising the time taken to report the trace data.

The message generator may generate groups of tokens representing the trace data. For example, in the case of the methods of FIG. 4 or 5, the message generator may generate a group comprising a token pair. The first token is an Elias gamma encoded instruction count. The second token is an Elias gamma encoded stall count. In the case of the method of FIG. 7, the message generator may generate a group comprising a token pair. The first token is an Elias gamma encoded clock cycle count. The second token is an Elias gamma encoded stall count. In either case, the group may additionally include a third token which is an Elias gamma encoded non-retired count.

Each component of the SoCs illustrated in FIGS. 1 to 3 and 6 may be implemented in dedicated hardware. Alternatively, each component of the SoC illustrated in FIGS. 1 to 3 and 6 may be implemented in software. Some components may be implemented in software, whilst other components are implemented in dedicated hardware.

The SoC described is suitably incorporated within a computing-based device. The computing-based device may be an electronic device. Suitably, the computing-based device comprises one or more processors for processing computer executable instructions to control operation of the device in order to implement the methods described herein. The computer executable instructions can be provided using any computer-readable media such as a memory. The methods described herein may be performed by software in machine readable form on a tangible storage medium. Software can be provided at the computing-based device to implement the methods described herein. For example, the tracing circuitry may comprise counting logic to perform the counting operations described herein.

The above description describes the system circuitry and tracing circuitry as being comprised on the same SoC. In an alternative implementation, the system circuitry and tracing circuitry are comprised across two or more integrated circuit chips of an MCM. In an MCM, the integrated circuit chips are typically stacked or located adjacently on an interposer substrate. Some system circuitry may be located on one integrated circuit chip and other system circuitry located on a different integrated circuit chip of the MCM. Similarly, the tracing circuitry may be distributed across more than one integrated circuit chip of the MCM. Thus, the method and apparatus described above in the context of an SoC also apply in the context of an MCM.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

What is claimed is:

1. A method of tracing instruction execution on a processor of an integrated circuit chip in real time whilst the processor continues to execute instructions during clock cycles of the processor, the method comprising:
at tracing circuitry on the integrated circuit chip:
monitoring the instruction execution of the processor by:
counting, using an instruction counter, a number of successively retired instructions to form an instruction count, wherein the successively retired instructions are generated contiguously in time, wherein the instruction counter stops counting when the instruction counter identifies a time gap in which the processor does not retire an instruction; and
counting, using a stall counter, a number of subsequent contiguous clock cycles of the processor during which no instruction is retired to form a stall count, wherein, in response to a signal from the instruction counter identifying that the instruction counter has stopped the counting, the stall counter starts counting immediately following an end of a series of successively retired instructions that are generated contiguously in time;
generating a trace message which comprises the instruction count and the stall count; and
outputting the trace message.

2. The method of claim 1, further comprising:
comparing the stall count to a threshold stall count; and
generating and outputting the trace message when the stall count is the same as or exceeds the threshold stall count.

3. The method of claim 2, further comprising:
when the stall count is less than the threshold stall count:
resetting the stall count to a count of 0;
counting a further number of successively retired instructions, which are generated contiguously;
counting the number of subsequent contiguous clock cycles of the processor during which no instruction is retired to form a further stall count;
comparing the further stall count to the threshold stall count; and generating a trace message comprising a further instruction count and the further stall count and outputting the trace message when the further stall count is the same as or exceeds the threshold stall count, wherein the further instruction count is a sum of the instruction count, the stall count, and the further number of successively retired instructions, which are generated contiguously.

4. The method of claim 3, further comprising:
incrementing the instruction count by the stall count to form an incremented instruction count, wherein counting the further number of successively retired instructions, which are generated contiguously, starts from the incremented instruction count, thereby forming the further instruction count.

5. The method of claim 3, further comprising:
resetting the instruction count to a count of 0, wherein counting the further number of successively retired instructions, which are generated contiguously, starts from 0, the method further comprising adding the instruction count, the stall count and the further number of retired instructions, which are generated contiguously to form the further instruction count.

6. The method of claim 3, further comprising, when the further stall count is less than the threshold stall count:
iteratively performing the resetting of the stall count, the counting of a further number of successively retired instructions, the counting of the number of subsequent contiguous clock cycles, and the comparing of the further stall count to the threshold count until the iterative stall count is the same as or exceeds the threshold stall count; and
generating and outputting the trace message when the iterative stall count is the same as or exceeds the threshold stall count.

7. The method of claim 1, wherein the trace message identifies how many successively retired instructions the processor has generated contiguously and how long the processor has stalled before resuming instruction execution.

8. The method of claim 1, further comprising:
analyzing the trace message; and
identifying potential changes to an instruction set and/or operation of the processor based on the analyzing of the trace message to optimize the operation of the processor.

9. A method of tracing instruction execution on a processor of an integrated circuit chip in real time whilst the processor continues to execute multiple instructions contemporaneously during clock cycles of the processor, the processor being capable of retiring more than one instruction per clock cycle, the method comprising:
at tracing circuitry on the integrated circuit chip:
monitoring the instruction execution of the processor by:
counting, using an instruction counter, a number of instructions successively retired in each clock cycle to form a clock cycle count, wherein the successively retired instructions are generated contiguously in time and wherein the instruction counter stops counting when the instruction counter identifies a time gap in which the processor does not retire an instruction; and
counting, using a stall counter, a number of contiguous clock cycles of the processor during which no instruction is retired to form a stall count, wherein, in response to a signal from the instruction counter identifying that the instruction counter has stopped the counting, the stall counter starts counting immediately following an end of a series of successively retired instructions that are generated contiguously in time;
generating a trace message which comprises the clock cycle count and the stall count; and
outputting the trace message.

10. The method of claim 9, further comprising:
counting a number of nonretired instruction executions to form a non-retired count.

11. The method of claim 10, wherein the trace message further comprises the non-retired count.

12. The method of claim 9, further comprising:
encoding the counts in the trace message using run length encoding.

13. The method of claim 12, further comprising:
encoding the counts in the trace message using Elias Gamma code.

14. An integrated circuit chip comprising:
a processor configured to execute instructions during clock cycles of the processor;
tracing circuitry configured to trace instruction execution of the processor in real time, the tracing circuitry comprising:
an instruction counter configured to count a number of successively retired instructions to form an instruction count, wherein the successively retired instructions are generated contiguously in time, and wherein the instruction counter is configured to stop counting when the instruction counter identifies a time gap in which the processor does not retire an instruction;
a stall counter configured to count a number of subsequent contiguous clock cycles of the processor during which no instruction is retired to form a stall count, wherein, in response to a signal from the instruction counter identifying that the instruction counter has stopped the counting, the stall counter is configured to start counting immediately following an end of a series of successively retired instructions that are generated contiguously in time;
a message generator configured to generate a trace message which comprises the instruction count and the stall count; and
an output configured to output the trace message.

15. The integrated circuit chip of claim 14, further comprising:
a comparator configured to compare the stall count to a threshold stall count.

16. An integrated circuit chip comprising:
a processor configured to retire more than one instruction per clock cycle of the processor;
tracing circuitry configured to trace instruction execution of the processor in real time, the tracing circuitry comprising:
a clock cycle counter configured to count a number of instructions successively retired in each clock cycle to form a clock cycle count, wherein the successively retired instructions are generated contiguously in time;
a stall counter configured to count a number of contiguous clock cycles of the processor during which no instruction is retired to form a stall count, wherein, in response to a signal from the clock cycle counter identifying that the clock cycle counter has stopped the counting, the stall counter is configured to start counting immediately following an end of a series of successively retired instructions that are generated contiguously in time;

a message generator configured to generate a trace message which comprises the clock cycle count and the stall count; and an output configured to output the trace message.

17. The integrated circuit chip of claim 16, further comprising:

a further counter configured to count a number of non-retired instruction executions to form a nonretired count.

* * * * *

UNITED STATES PATENT AND TRADEMARK OFFICE
CERTIFICATE OF CORRECTION

| | |
|---|---|
| PATENT NO. | : 11,907,100 B2 |
| APPLICATION NO. | : 16/850100 |
| DATED | : February 20, 2024 |
| INVENTOR(S) | : Iain Robertson |

It is certified that error appears in the above-identified patent and that said Letters Patent is hereby corrected as shown below:

In the Claims

Column 13 (Claim 5; Lines 23-24):
"instruction count, the stall count and the further number of retired instructions,"
Should be replaced with:
"instruction count, the stall count and the further number of successively retired instructions,"

Signed and Sealed this
Thirtieth Day of April, 2024

Katherine Kelly Vidal
*Director of the United States Patent and Trademark Office*